United States Patent
Tsuji et al.

(10) Patent No.: US 6,791,405 B2
(45) Date of Patent: Sep. 14, 2004

(54) TRIANGULAR WAVE GENERATING CIRCUIT USED IN A CLASS-D AMPLIFIER

(75) Inventors: Nobuaki Tsuji, Hamamatsu (JP); Masao Noro, Hamamatsu (JP)

(73) Assignee: Yamaha Corporation, Hamamatsu (JP)

(*) Notice: Subject to any disclaimer, the term of this patent is extended or adjusted under 35 U.S.C. 154(b) by 0 days.

(21) Appl. No.: 10/400,357

(22) Filed: Mar. 27, 2003

(65) Prior Publication Data

US 2004/0036529 A1 Feb. 26, 2004

(30) Foreign Application Priority Data

Mar. 28, 2002 (JP) ..................................... P2002-091867
Jun. 21, 2002 (JP) ..................................... P2002-181772

(51) Int. Cl.[7] ................................................ H03F 3/38
(52) U.S. Cl. ...................... 330/10; 327/131; 327/132; 327/137
(58) Field of Search ............................ 330/10; 327/131, 327/132, 137, 134, 136

(56) References Cited

U.S. PATENT DOCUMENTS 5,642,066 A * 6/1997 Burke ......................... 327/132
6,121,805 A * 9/2000 Thamsirianunt ............. 327/131
6,320,460 B1  11/2001 Meszlenyi ..................... 330/10

FOREIGN PATENT DOCUMENTS

JP              62242410        * 10/1987

OTHER PUBLICATIONS

Vidal et al. "Amplitude stabilization in a triangle wave quadrature oscillator" IEEE 39th Midwest symposium on Circuits & Systems vol. 3 Aug. 18–25, 1996 pp 1083–1086.*

* cited by examiner

Primary Examiner—Michael B Shingleton
(74) Attorney, Agent, or Firm—Pillsbury Winthrop LLP

(57) ABSTRACT

The integrating circuit of the triangular wave generating circuit includes an operational amplifier and a capacitor. Switch elements are alternatively turned ON and capacitors are alternatively recharged by the currents flowing in constant-current circuits thus obtaining a triangular wave on an output terminal. In this practice, when the voltage on the output terminal reaches ±1 V, comparator circuits (41, 42) and a flip-flop including NAND gates change over the switch elements. The currents flowing in the constant-current circuits are controlled depending on the current flowing in a load circuit. The current flowing in the load circuit is controlled by a PLL circuit including a phase comparator circuit, a loop filter, an LPF, an operational amplifier and an FET. This provides an output triangular wave having the same frequency as a clock pulse (CK).

4 Claims, 10 Drawing Sheets

FIG. 2A Vout
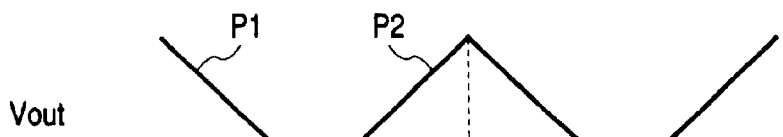
FIG. 2B NLO
FIG. 2C NLON
FIG. 2D NFB
FIG. 2E NHI
FIG. 2F CK
FIG. 2G PLLC

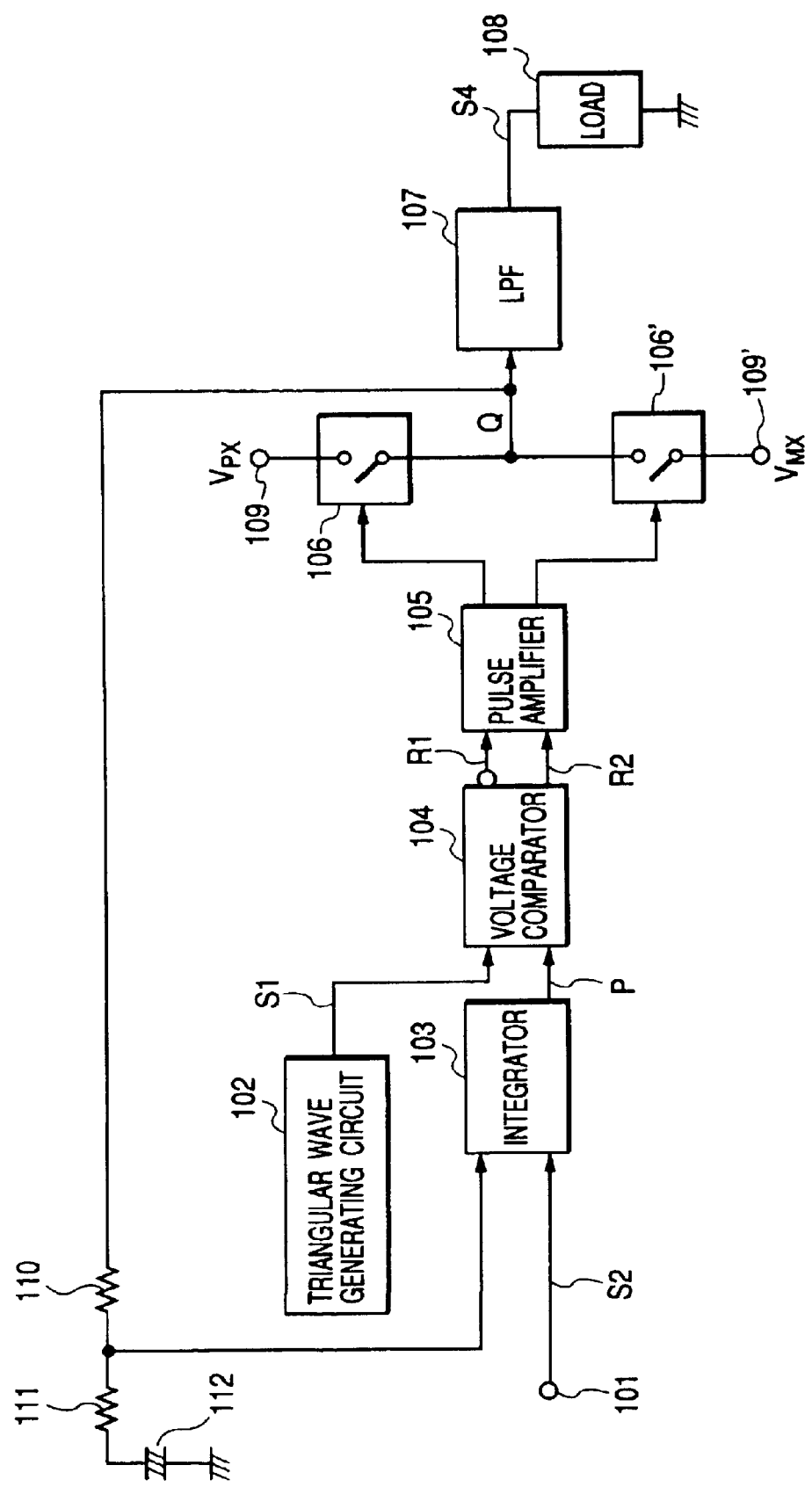

US 6,791,405 B2

TRIANGULAR WAVE GENERATING CIRCUIT USED IN A CLASS-D AMPLIFIER

BACKGROUND OF THE INVENTION

The present invention relates to a Class-D amplifier mainly used for power amplification of an audio signal and in particular to a triangular wave generating circuit used to convert an analog audio signal to a pulse signal.

FIG. 6 is a block diagram showing an exemplary configuration of a Class-D amplifier. In this figure, a numeral 101 represents an analog signal input terminal, 102 a triangular wave generating circuit, 103 an integrator, 104 a voltage comparator for comparing the output of the integrator 103 with the output of the triangular wave generating circuit 102, 105 a pulse amplifier, 106, 106' switching elements controlled to turn ON/OFF by the output of the pulse amplifier 105, and 109, 109' positive and negative power sources. A numeral 110 represents a resistor for feeding back a PWM signal obtained at the junction of the switching elements 106 and 106' to the integrator 103. The resistor 110 and a resistor 111 determine the feedback amount. A capacitor 112 is a DC cutoff capacitor. A numeral 107 represents an LPF (low-pass filter) and 108 represents a load.

FIG. 7 is a waveform diagram showing the waveform of each section of FIG. 6. FIG. 7A shows the waveform of the output S1 of the triangular wave generating circuit 102, FIG. 7B the waveform of an analog signal S2 input to the input terminal 101, FIG. 7C the waveform of a signal (PWM signal) on the non-inverted output terminal of the voltage comparator circuit 104, FIG. 7D the waveform of an output signal S4 of the LPF 107. FIG. 8 is a waveform diagram showing the waveforms of the output S1 of the triangular wave generating circuit 102, signals at the output terminals R1, R2 of the voltage comparator 104, and a signal at the junction Q of the switching elements 106, 106'. In FIG. 8, a sign P represents the output of the integrator 103 and a sign P' an ideal waveform of the output of the integrator 103.

As shown in these figures, the analog input signal S2 is supplied to the voltage comparator via the integrator 103. The signal is compared with the output S1 of the triangular wave generating circuit 101 and converted to a PWM-modulated pulse signal in the voltage comparator 104 (see FIG. 8B and FIG. 8C). Then, the signal is amplified by the pulse amplifier 105 and switching-amplified by the switching elements 106, 106'. The switching-amplified signal is turned into the analog signal S4 by the LPF 107 and output to the load 108.

FIG. 9 is a circuit diagram showing the details of the Class-D amplifier shown in FIG. 6. The integrator 103 comprises an operational amplifier 121 and a capacitor inserted between the non-inverted input terminal and the output terminal of the operational amplifier 121. The LPF 107 comprises a coil 124 and a capacitor 125.

In the Class-D amplifier, the precision of a triangular wave generated in the triangular wave generating circuit 103 has a great effect on the distortion of amplification. Thus, it is quite important to generate a high-precision triangular wave with negligible variations in the peak value and a negligible offset deviation.

FIG. 10 is a circuit diagram showing an exemplary configuration of a related art triangular wave generating circuit. In FIG. 10, a numeral 1 represents an input terminal where a clock pulse of a duty ratio of 50 percent is input, 2 an amplifier, 3 a resistor, 4 an operational amplifier, 5 a capacitor, and 6 an output terminal. In this circuit, when a pulse input to the input terminal goes high and low alternately, recharging/discharging of the capacitor 5 takes place accordingly, and an output voltage Vout changes in a shape of a triangle.

FIG. 11 is a circuit diagram showing another exemplary configuration of a related art triangular wave generating circuit. In FIG. 11, numerals 1, 2, 4 through 6 are same as those in FIG. 10. Numerals 11, 12 represent switch elements controlled to turn ON/OFF by the output of the amplifier 2. Numerals 13, 14 represent are respectively constant-current circuits. In this circuit, when the switch element 11 is turned ON and the switch element 12 is turned OFF, the capacitor 5 is recharged by a current I1. When the switch element 11 is turned OFF and the switch element 12 is turned ON, the capacitor 5 is recharged in a direction opposite to the above direction by a current I2. This operation is repeated to cause the output voltage Vout to be changed in a shape of a triangle.

In the circuit of FIG. 10, the output voltage Vout is obtained using the following expressions:

$Q = CV$ (Q: electric charge of the capacitor 5; C: capacitance of the capacitor 5; V: voltage of the capacitor 5)

$it = CVout$ (i: current flowing in the capacitor 5)

$Vout = it/C = (RVin)/C$ (R: value of the resistor 3; Vin: input voltage)

As understood from the calculation, the output voltage Vout depends on the value R of the resistor 3, the capacitance C of the capacitor 5 and the amplitude and frequency of the input clock pulse. In general, the value R of the resistor 3 and the capacitance C of the capacitor 5 are varied so that the peak value of the output voltage Vout does not stay constant.

In the circuit shown in FIG. 11, an offset is generated on the output voltage Vout by a slight deviation of the duty ratio of the input clock pulse and the current value of the constant-current circuits 13, 14, as shown in FIG. 12B. FIG. 12A shows a triangular wave free from an offset deviation.

SUMMARY OF THE INVENTION

The invention has been proposed under such circumstances and aims at providing a triangular wave generating circuit used in a Class-D amplifier which can generate a high-precision triangular wave free from variations in the peak value or offset deviation.

In order to solve the aforesaid object, the invention is characterized by having the following arrangement.

(1) A triangular wave generating circuit used in a Class-D amplifier, comprising:

an integrating unit including an amplifier and a capacitor inserted between the input terminal and output terminal of the amplifier;

a first constant-current unit which recharges the capacitor so that the output of the amplifier approaches a first predetermined voltage;

a second constant-current unit which recharges the capacitor so that the output of the amplifier approaches a second predetermined voltage;

a current setting unit which sets currents of the first and second constant-current units;

a first switch unit which makes ON/OFF control of the current flowing in the first constant-current unit;

a second switch unit which makes ON/OFF control of the current flowing in the second constant-current unit;

a first comparing unit which compares the output of the amplifier with the first predetermined voltage and outputs a signal when the output of the amplifier coincides with the first predetermined voltage;

a second comparing unit which compares the output of the amplifier with the second predetermined voltage and outputs a signal when the output of the amplifier coincides with the second predetermined voltage; and a flip-flop whose output signal is inverted depending on the output of the first and second comparing unit, the flip-flop making ON/OFF control of the first and second switch units.

(2) The triangular wave generating circuit according to (1), wherein the current setting unit includes:

a phase comparing unit which compares the phase of an externally supplied clock pulse with the phase of the output of the flip-flop, a low-pass filter for removing the high-frequency component of the output of the phase comparing unit, and a current control unit which controls the currents of the first and second constant-current unit.

(3) A triangular wave generating circuit used in a Class-D amplifier, comprising:

an integrating unit including an amplifier and a capacitor inserted between the input terminal and output terminal of the amplifier;

a first current mirror circuit which recharges the capacitor so that the output of the amplifier approaches a first predetermined voltage;

a second current mirror circuit which recharges the capacitor so that the output of the amplifier approaches a second predetermined voltage;

a first switch unit which makes ON/OFF control of the current flowing in the first current mirror circuit;

a second switch unit which makes ON/OFF control of the current flowing in the current mirror circuit;

a first comparing unit which compares the output of the amplifier with the first predetermined voltage and outputs a signal when the output of the amplifier coincides with the first predetermined voltage;

a second comparing unit which compares the output of the amplifier with the second predetermined voltage and outputs a signal when the output of the amplifier coincides with the second predetermined voltage;

a flip-flop whose output signal is inverted depending on the output of the first and second comparing units, the flip-flop making ON/OFF control of the first and second switch units;

a phase comparing unit which compares the phase of an externally supplied clock pulse with the phase of the output of the flip-flop;

a low-pass filter which removes the high-frequency component of the output of the phase comparing unit, and a current control unit which controls the currents of the first and second current mirror circuits.

(4) A Class-D amplifier comprising:

a modulation stage which PWM-modulates an input signal by using a triangular wave output from a triangular wave generating circuit; and a switching amplification stage which makes switching amplification of the output of the modulation stage by using a switching element, wherein the triangular wave generating circuit includes, a voltage divider circuit for dividing the positive source voltage and negative source voltage of the switching amplification stage at a predetermined division ratio respectively and outputting the resulting voltages as a first voltage and a second voltage, an integrating unit including an amplifier and a capacitor inserted between the input terminal and output terminal of the amplifier, a first constant-current unit which recharges the capacitor so that the output of the amplifier approaches a first predetermined voltage, a second constant-current unit which recharges the capacitor so that the output of the amplifier approaches a second predetermined voltage, a current setting unit which sets currents of the first and second constant-current units, a first switch unit which makes ON/OFF control of the current flowing in the first constant-current units, a second switch unit which makes ON/OFF control of the current flowing in the second constant-current unit, a first comparing unit which compares the output of the amplifier with the first predetermined voltage and outputs a signal when the output of the amplifier coincides with the first predetermined voltage, a second comparing unit which compares the output of the amplifier with the second predetermined voltage and outputs a signal when the output of the amplifier coincides with the second predetermined voltage, and a flip-flop whose output signal is inverted depending on the output of the first and second comparing units, the flip-flop making ON/OFF control of the first and second switch units.

BRIEF DESCRIPTION OF THE DRAWINGS

FIGS. 2A to 2G are a timing chart to describe the operation of this embodiment;

FIG. 6 is a block diagram showing the configuration of a general Class-D amplifier;

DETAILED DESCRIPTION OF PREFERRED EMBODIMENTS

Embodiments according to the invention will be described with reference to attached drawings.

First Embodiment

Figure 1:
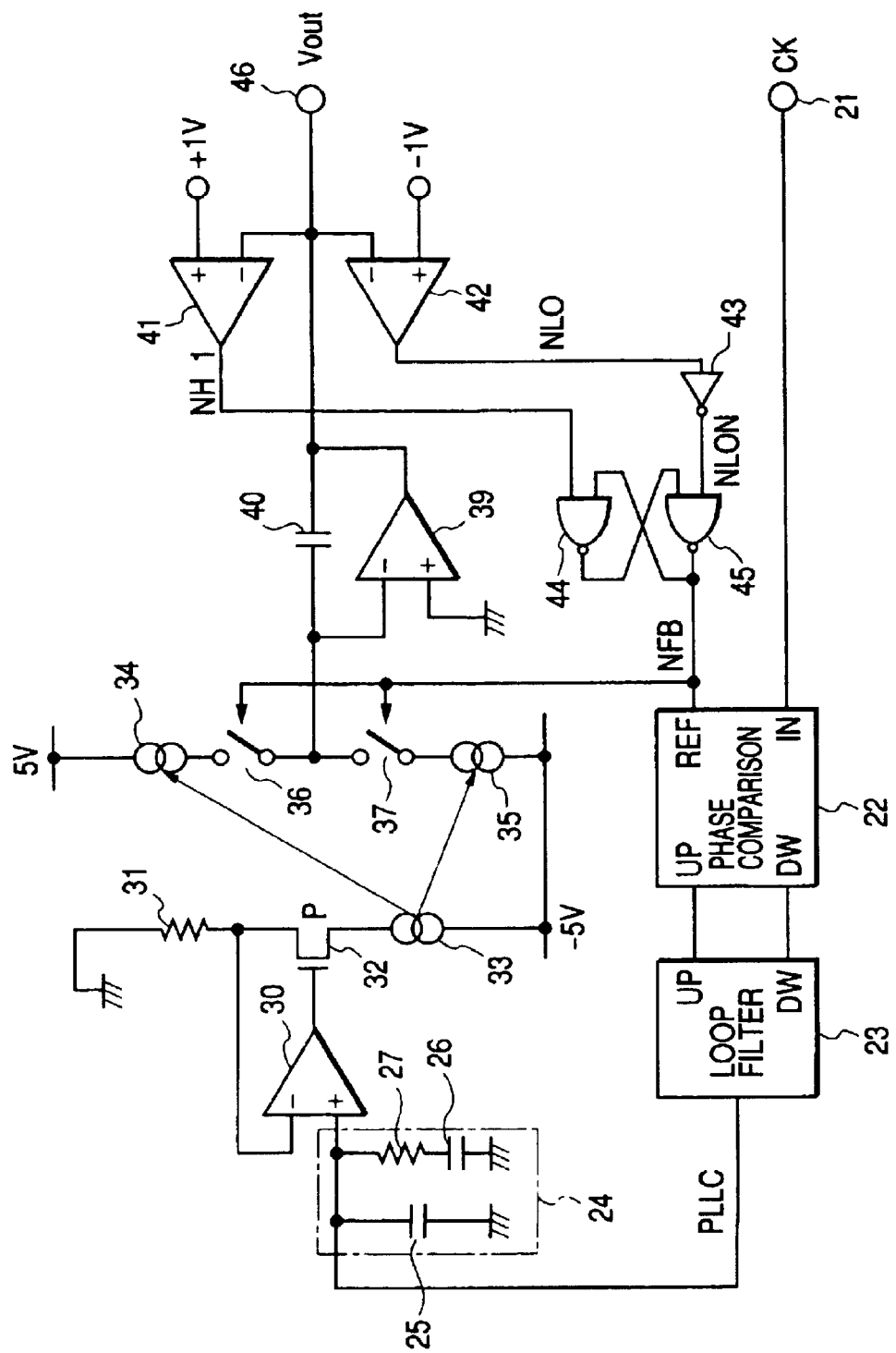
FIG. 1 is a block diagram showing the configuration of a triangular wave generating circuit according to one embodiment of the invention.

FIG. 1 is a circuit diagram showing the configuration of a triangular wave generating circuit according to a first embodiment of the invention. In FIG. 1, a numeral 21 represents a terminal where a reference clock pulse CK is input. A numeral 22 represent a digital phase comparator which compares the phase of the clock pulse CK input to the reference input terminal IN with the phase of a signal NFB at the comparison input terminal REF and outputs a signal at the high level from an output terminal UP or an output terminal DW in accordance with the comparison result. A numeral 23 represents a loop filter which converts the output of the phase comparator circuit 22 to an analog signal PLLC and outputs the signal PLLC. A numeral 24 represents a circuit formed by capacitors 25, 26 and a resistor 27. The capacitors 25, 26, the resistor 27 and the loop filter 23 constitute a low-pass filter to remove the high-frequency of the output of the loop filter 23.

A numeral 30 represent an operational amplifier. The output PLLC of the loop filter is input to its non-inverted input terminal, and its inverted input terminal is connected to the source of an FET (field-effect transistor) 32. The output terminal of the operational amplifier is connected to the gate of the FET 32. The source of the FET 32 is grounded via a resistor 31. The drain of the FET 32 is connected to a negative power source (−5 V) via a load circuit 33. The load circuit 33 works as a load on the FET 32 and comprises a single FET. The operational amplifier 30, the FET 32 and the resistor 31 constitutes a circuit for controlling a current flowing in the load circuit 33 depending on the level of the output PLLC of the loop filter 23.

Numerals 34, 35 represent constant-current circuits and their current values are controlled by a current flowing in the load circuit 33. A current same as that flowing in the load circuit 33 flows in the constant-current circuits 34, 35. Numerals 36, 37 represent switch elements which are controlled to turn ON/OFF by the signal NFB. When the signal NFB is low, the switch elements 36 and 37 is ON and OFF, respectively. When the signal NFB is high, the switch elements 36 and 37 are Off and ON, respectively. A numeral 39 represents an operational amplifier. The non-inverted input terminal of the operational amplifier is grounded and its inverted input terminal is connected to the junction of the switch elements 36, 37, and its output terminal is connected to an output terminal 46. A numeral 40 represents a capacitor inserted between the inverted input terminal and the output terminal of the operational amplifier 39. The operational amplifier 39 and the capacitor 40 constitute an integrating circuit.

A numeral 41 represents a comparator circuit. The output of the operational amplifier 39 is input to its inverted input terminal, and a voltage of +1 V is input to its non-inverted input terminal. A numeral 42 is a comparator circuit. The output of the operational amplifier 39 is input to its inverted input terminal and a voltage of −1 V is input to its non-inverted input terminal. The output of the comparator 41 is input to one of the input terminals of a NAND gate 44. The output of the comparator 42 is input to one of the input terminals of a NAND gate 45 via an inverter 43. The NAND gates 44, 45 constitute an RS (set/reset) flip-flop, whose output is supplied, as the signal NFB, to switch elements 36, 37 and the phase comparator 22.

As understood from the forgoing description, a triangular wave generating circuit shown in FIG. 1 is a PLL (phase-locked loop) circuit.

Next, the operation of the aforementioned triangular wave generating circuit will be described with reference to the timing chart of FIG. 2.

When the circuit is powered, either the switch element 36 or 37 is turned ON as the output signal of the NAND gate goes high or low. Assuming the signal NFB is low and the switch element 36 is ON, the capacitor 40 is sequentially recharged by the current flowing in the constant-current circuit 34 and the output of the operational amplifier 39 drops linearly (see a sign P1 in FIG. 2A). When the output of the operational amplifier 39 reaches −1 V (time t1), the output signal NLO of the comparator circuit 42 is driven high (FIG. 2B), the output signal NLON of the inverter 43 (FIG. 2C) is driven low, then the output signal NFB of the NAND gate 45 is driven high (FIG. 2D).

When the signal NFB goes high, the switch element 36 is turned OFF and the switch element 37 is turned ON. The capacitor 40 is recharged in a direction opposite to the above direction by the current flowing in the constant-current circuit 35, then the output voltage of the operational amplifier 39 starts to rise. When the output voltage of the operational amplifier 39 rises, even slightly, the output signal NLO of the comparator circuit 42 returns to low (FIG. 2B) while the signal NFB stays high. This causes the output of the operational amplifier 39 to rise gradually (a sign P2 in FIG. 2A).

At the time t2, when the output of the operational amplifier reaches +1 V, the output signal NHI of the comparator circuit 41 goes low (FIG. 2E). Then the output signal NFB of the NAND gate 45 is inverted to go low (FIG. 2D). When the signal NFB goes low, the switch element 37 is turned OFF and the switch element 36 is turned ON. The output of the operational amplifier 39 starts to drop again. When the output of the operational amplifier 39 starts to drop, the output signal NHI of the comparator circuit 41 returns to high.

The aforementioned operation is repeated, and as a result, an output voltage Vout by a triangular wave is obtained on the output terminal 46. As understood from the foregoing description, the speeds of rise and fall of the triangular wave are determined by the current values of the constant-current circuits 34, 35. In case the current value is large, the leading edge and the trailing edge of the waveform are steeper. In case the current value is small, the leading edge and the trailing edge of the waveform are flatter. While voltages of +1 V and −1 V are input to the comparator circuits 41, 42, other predetermined voltages may be input to the comparator circuits 41, 42.

Circuits for determining the current values of the constant-current circuits 34, 35 are the phase comparator circuit 22, the loop filter 23, the low-pass filter 24, the operational amplifier 30, the resistor 31, the FET 32 and the load circuit 33. Operation of these circuits will be described.

When the reference clock pulse CK (FIG. 2F) is input to the terminal 21, the phase comparator circuit 22 compares the phase of the signal NFB and the phase of the clock pulse CK, and outputs a signal depending on the comparison result to the loop filter 23. The loop filter 23 outputs the analog signal PLLC (FIG. 2G) corresponding to the output of the phase comparison circuit 22 to the operational amplifier 30 via a low-pass filter 24. The operational amplifier 30 controls the current flowing in the load circuit 33 based on the signal PLLC. When the level of the signal PLLC becomes larger, the output of the operational amplifier 30 rises, which decreases the source-to-gate bias of the FET 32 thus reducing the current flowing in the load circuit 33. When the level of the signal PLLC becomes smaller, the output of the operational amplifier 30 drops, which increases the source-to-gate bias of the FET 32 thus increasing the current flowing in the load circuit 33.

When the current flowing in the load circuit 33 varies, the currents of the constant-current circuits 34, 35 vary, which changes the gradients of the leading edge and falling edge of the output of the operational amplifier 39, thus shifting the period of the signal NFB. This action of the PLL (phase-locked loop) causes the signal NFB to shift to come in phase with the clock pulse CK. This causes the period of the signal NFB to align with that of the clock pulse CK. That is, the period of the triangular wave on the output terminal 46 aligns with that of the reference clock pulse CK.

In this way, according to the triangular wave generating circuit in this embodiment, it is possible to obtain a triangular wave having the same period as the reference clock pulse CK on the output terminal 46. The peak voltage of the triangular wave is accurately specified by the voltage ±1 V input to the comparator circuits 41, 42 so that it is possible to obtain a triangular wave without any variation in the peak voltage. Further, the recharging/discharging current is determined by the constant-current circuits 34, 35 and stays at the same level. This avoids an offset deviation.

Figure 3:
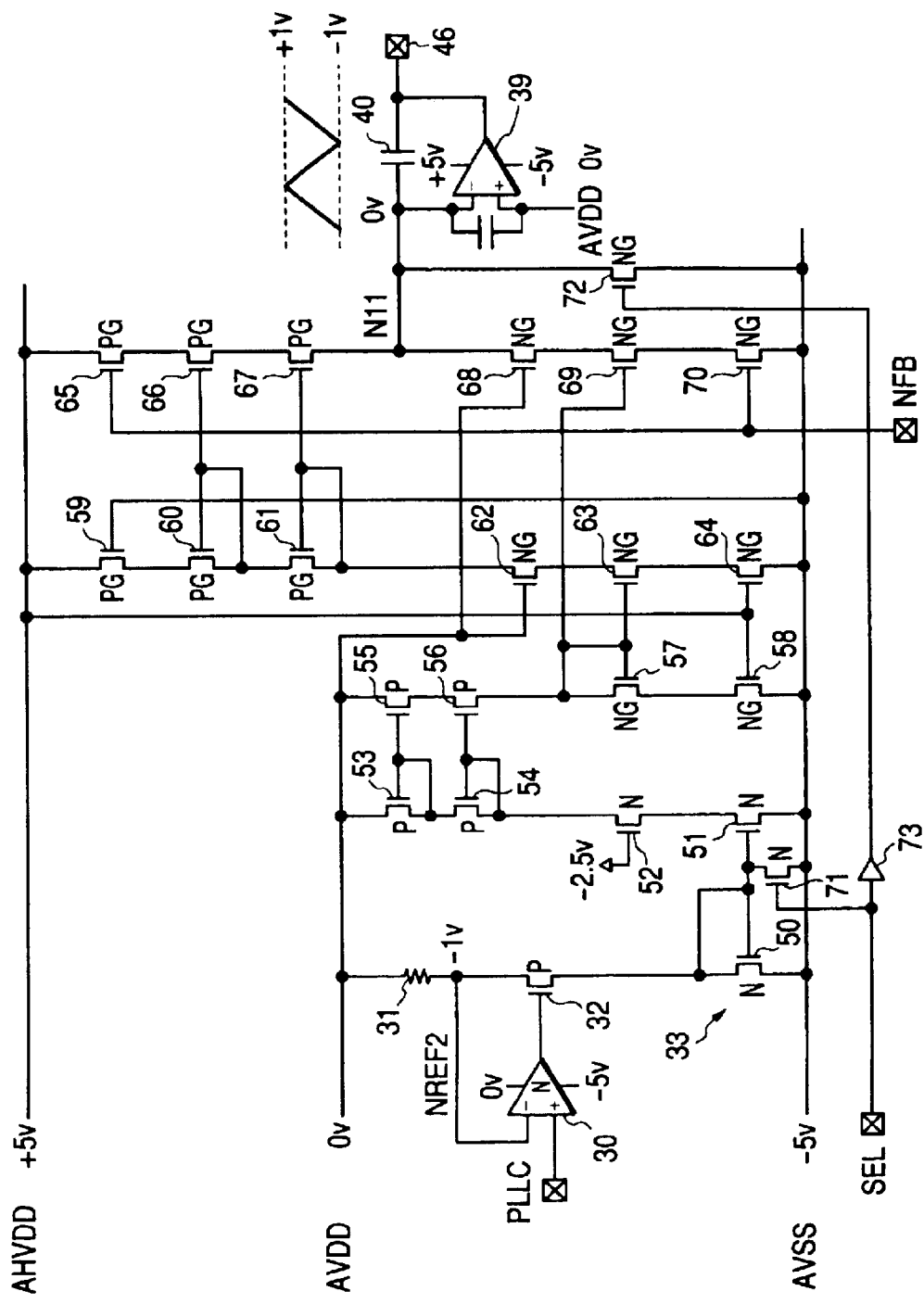
FIG. 3 is a circuit diagram showing a specific configuration of a circuit section comprising a resistor 31, an FET 32, a load circuit 33, constant-current circuits 34, 35, and switch elements 36, 37 in this embodiment.

A specific configuration example of a circuit section including the resistor 31, the FET 32, the load circuit 33, the constant-current circuits 34, 35 and the switch elements 36, 37 will be described referring to FIG. 3. In FIG. 3, signs N, NG, P and PG represent N channels of FET and P channels of FET, respectively.

In FIG. 3, the load circuit 33 comprises an FET 50. The gate of the FET 50 is connected to the source of the FET 50 and the gate of the FET 51. Thus, a circuit including the FET 50, the FET 32 and the resistor 31 and serially connected circuits including FETs 51 through 54 constitute a current mirror circuit. The same current flows in the FET 50 and the FETs 51 through 54. The gate of the FET 53 is connected to the source of the FET 53 and the gate of the FET 55. The gate of the FET 54 is connected to the source of the FET 54 and the gate of the FET 56. Thus, serially connected circuits including FETs 51 through 54 and serially connected circuits including FETs 55 through 58 constitute a current mirror circuit. The same current flows in both circuits. Changing the size of each FET can cause currents to flow in both circuits to charge. In this case, a current flowing in each FET is proportional to the size of the FET. While a current mirror circuit is provided even when the FETs 54, 56 are not used (short-circuited), the precision of the current is higher when the FETs 54, 56 are used. The FET 52 serves to adjust the ON resistance of the circuits.

The gate of the FET 57 is connected to the source of the FET 57 and the gate of the FET 63. Serially connected circuits including FETs 55 through 58 and serially connected circuits including FETs 59 through 64 constitute a current mirror circuit. The same current flows in the serially connected circuits comprising FETs 55 through 58 and the serially connected circuits comprising FETs 59 through 64. The gate of the FET 60 is connected to the source of the FET 60 and the gate of the FET 66. Serially connected circuits including FETs 59 through 64 and serially connected circuits including FETs 65 through 67 constitute a current mirror circuit. The same current flows in both circuits.

The gate of the FET 57 is connected to the gate of the FET 69. The same current flows in the serially connected circuits including FETs 55 through 58 and serially connected circuits including FETs 68 through 70. The FET 65 constitutes the switch element 36 of FIG. 1 and the FET 70 constitutes the switch element 37 of FIG. 1. The FETs 58, 59, 62, 64, 68 are FETs for adjusting ON resistance. The FETs 71, 72 and the amplifier 73 are circuits for halting generation of a triangular wave.

As understood from the foregoing description, the same current as that flowing in the FET 50 (load circuit 33) flows in the serially connected circuits including FETs 65 through 67 when the FET 65 is turned ON, and the serially connected circuits including FETs 68 through 70 when the FET 70 is turned ON.

Second Embodiment

Figure 9:
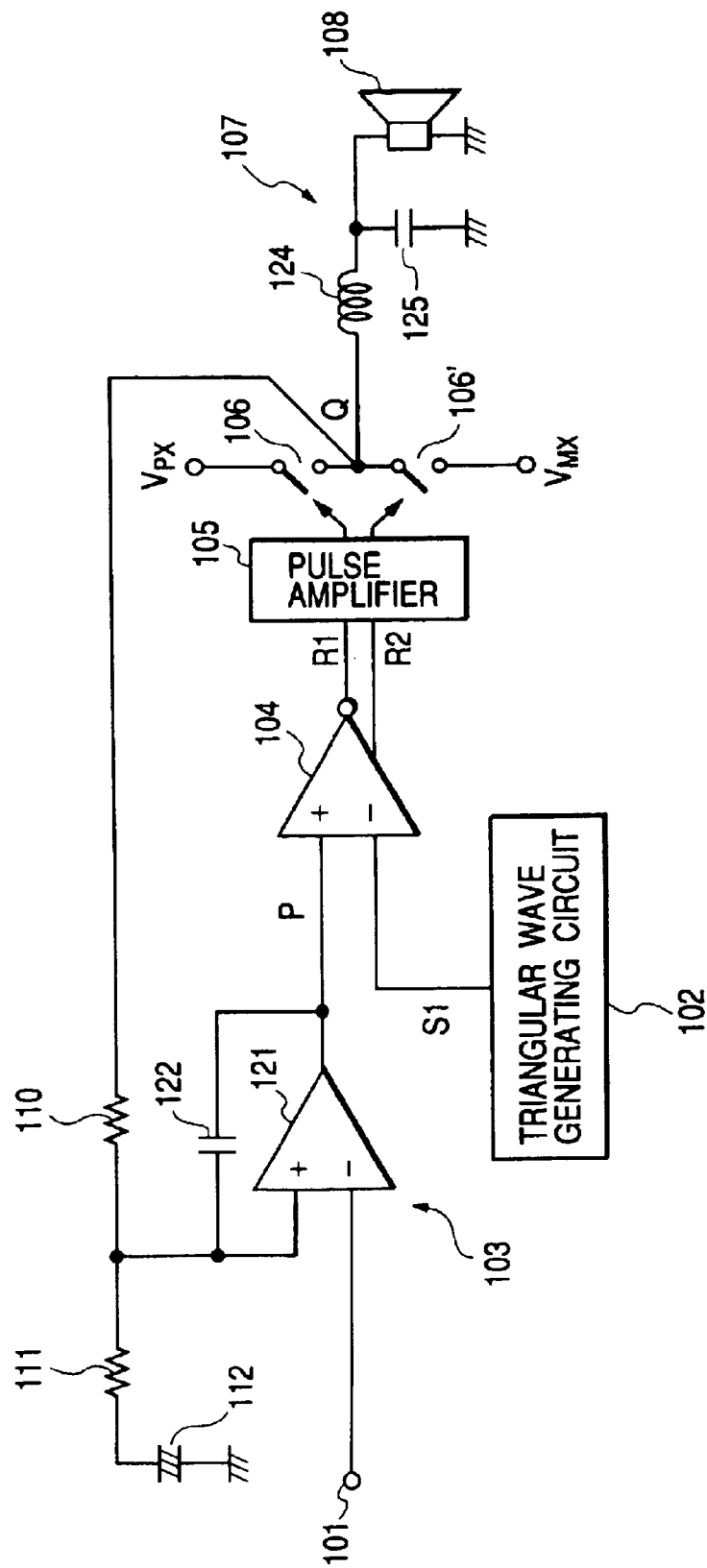
FIG. 9 is a circuit diagram showing the detailed configuration of the Class-D amplifier.
Figure 10:
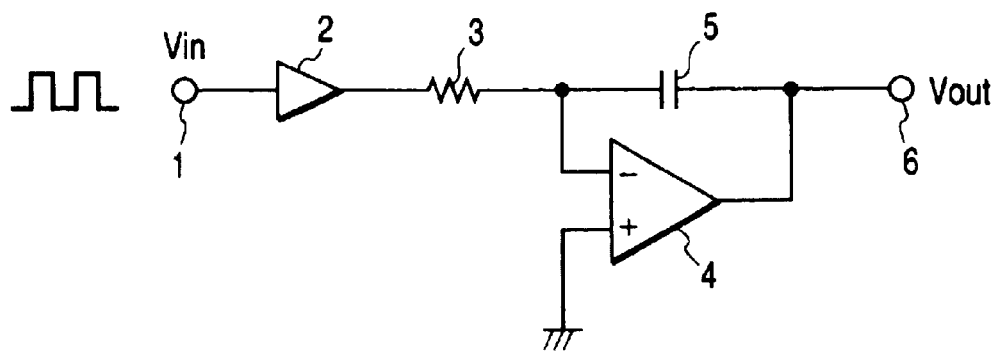
FIG. 10 is a circuit diagram showing an exemplary configuration of a related art triangular wave generating circuit.
Figure 11:
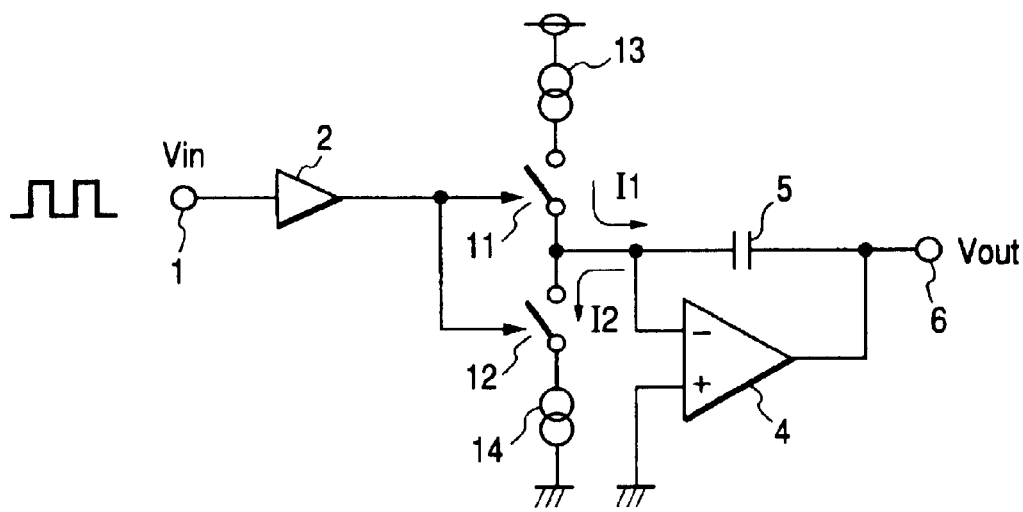
FIG. 11 is a circuit diagram showing another exemplary configuration of a related art triangular wave generating circuit.
Figure 12A:
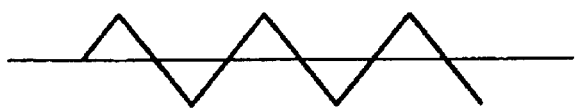
FIGS. 12A and 12B are waveform diagrams illustrating the problems with the triangular wave generating circuit shown in FIG. 11.
Figure 12B:
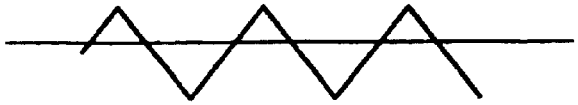

Prior to describe a second embodiment according to the invention, a case that the triangular wave generating circuit according to the first embodiment is used as the triangular wave generating circuit 102 in FIG. 9 will be described.

A gain G from the input terminal P of the comparator 104 to the junction Q of the switching elements 106, 106' is obtained by the expression below. Assuming that the maximum value and minimum value of the output S1 of the triangular wave generating circuit 102 as VP and VM respectively, the source voltage input to the switching element 106 as VPX (positive power source), and the source voltage input to the switching element 106' as VMX (negative power source), the amplitude of the signal appearing on the input terminal P is (VP−VM) and the amplitude of the signal appearing on the output terminal Q is (VPX−VMX), so that $$G=(VPX-VMX)/(VP-VM) \tag{1}$$

Here, the source voltages VPX and VMX may vary. When the source voltages VPX and VMX vary, the aforementioned gain G varies, and as a result, stability of a system changes and a stability more than necessary must be provided. A high stability power source may be used as an input to the switching elements 106, 106' to suppress the variation in the gain. This results in a complicated and costly power circuit design. The second embodiment described hereinafter provides a circuit which prevents variations in the gain without using a high stability power source.

Figure 4:
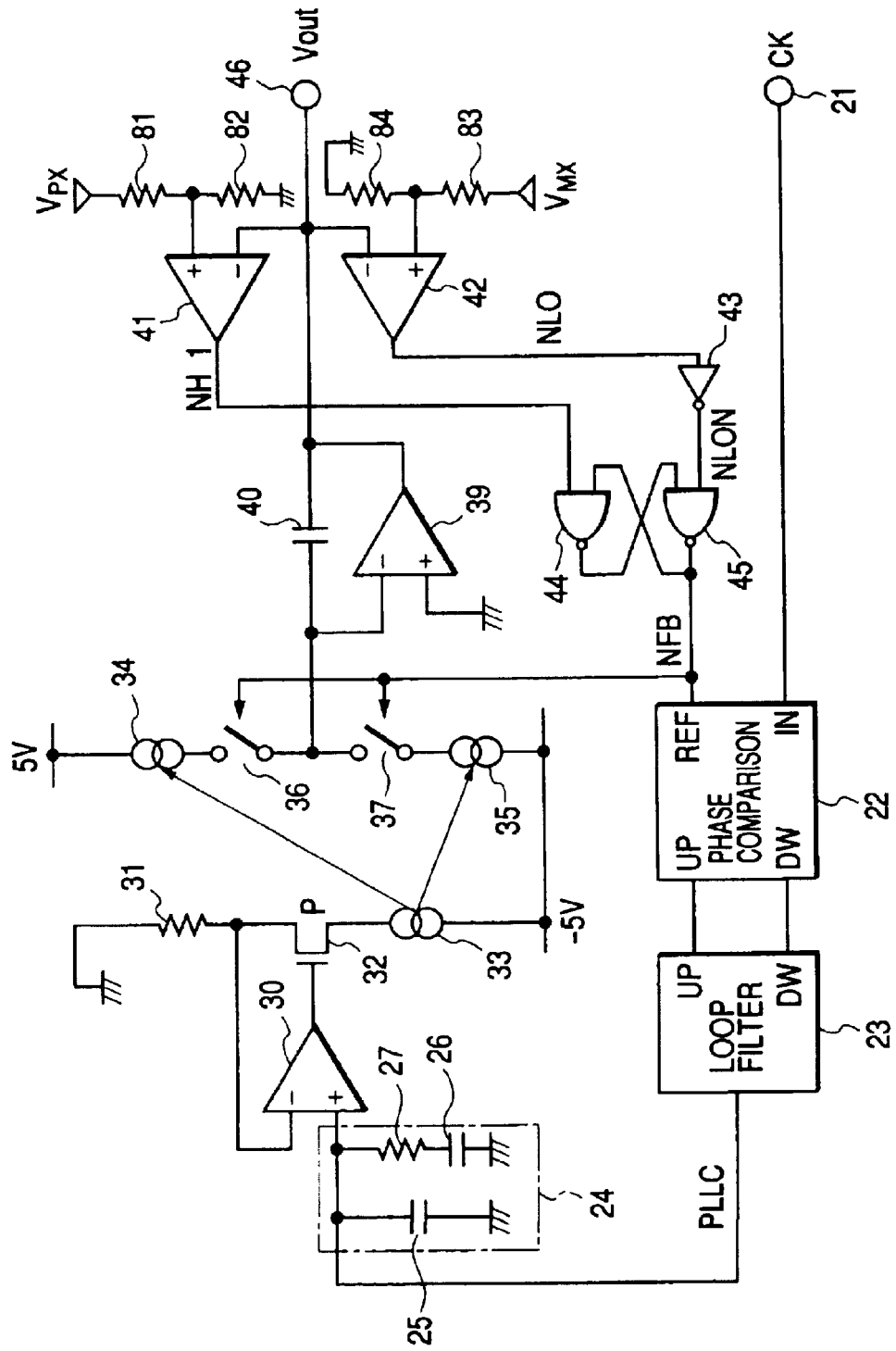
FIG. 4 is a block diagram showing the configuration of a triangular wave generating circuit according to another embodiment of the invention.

FIG. 4 is a circuit diagram showing the configuration of a triangular wave generating circuit according to the second embodiment. The circuit shown in this figure differs from that shown in FIG. 1 with respect to signals input to the non-inverted input terminals of the comparators 41, 42. In the circuit shown in FIG. 1, certain voltages are input to these non-inverted input terminals. In the second embodiment, a voltage obtained by dividing the source voltage VPX by resistors 81, 82 is input to the non-inverted input terminal of the comparator circuit 41 while a voltage obtained by dividing the source voltage VMX by resistors 83, 84 is input to the non-inverted input terminal of the comparator circuit 42. In this case, the resistance values (R81, R83) of the resistors 81 and the resistor 83 are the same and the resistance values (R82, R84) of the resistors 82 and the resistor 84 are the same. Thus, voltages V1 and V2 obtained below are input to the non-inverted input terminals of the comparator circuits 41, 42:

$$V1=VPX/a \tag{2}$$

$$V2=VMX/a \tag{3}$$

where a is a positive constant;

$$a=(R81+R82)/R82=(R83+R84)/R84$$

Thus, the maximum value VP and minimum value VM of a triangular wave output from the output terminal 46 are the voltages V1, V2 respectively. As a result, the gain G of Expression (1) is obtained:

$$G = (VPX - VMX)/(V1 - V2) \quad (4)$$
$$= (VPX - VMX)/(VPX/a - VMX/a)$$
$$= a$$

In this way, the gain G is not influenced by variations in the source voltages VPX, VMX supplied to the switching elements 106, 106'. The gain G stays constant even when the source voltages VPX, VMX vary.

Figure 5:
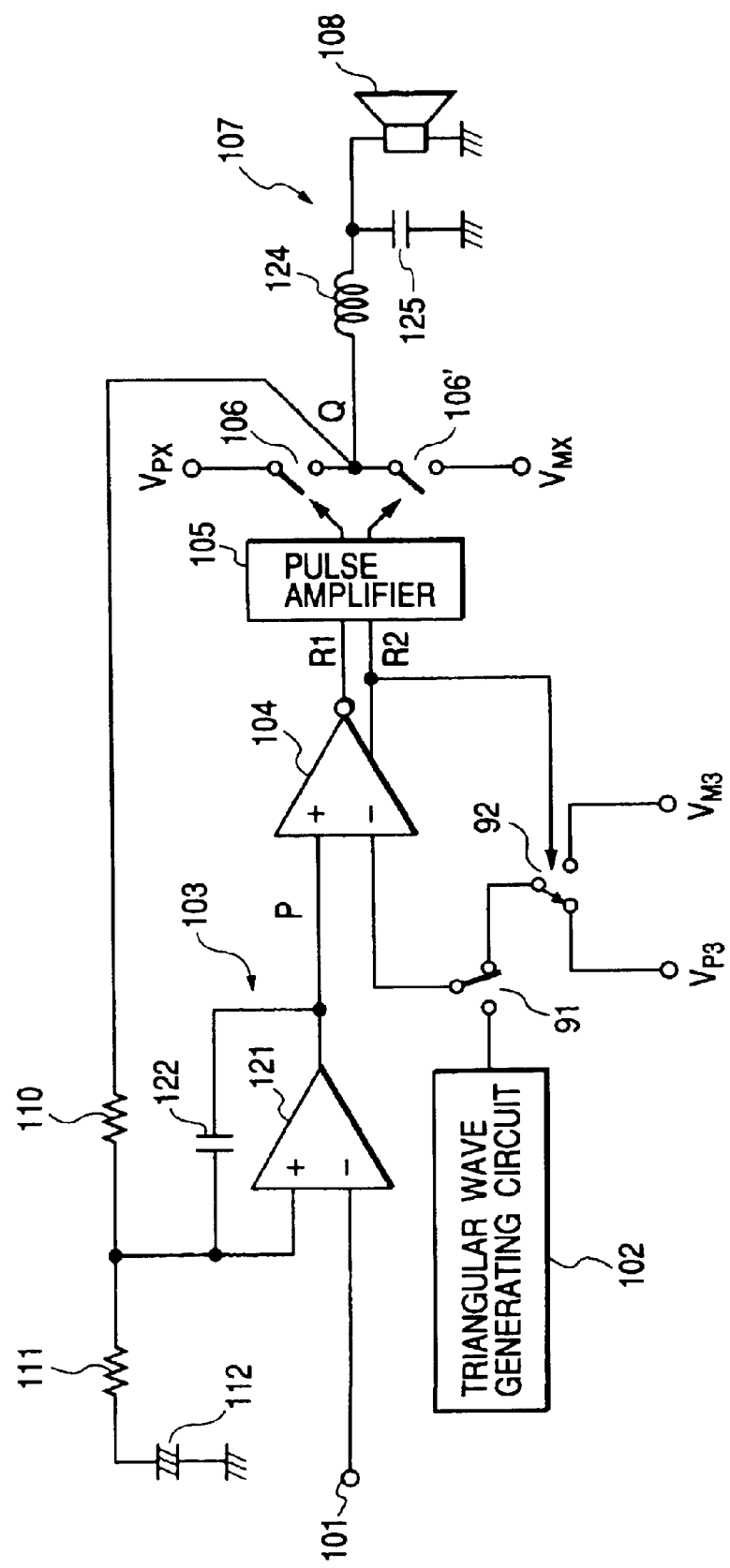
FIG. 5 is a circuit diagram showing an exemplary configuration of a Class-D amplifier using a triangular wave generating circuit shown in FIG. 4.
Figure 7A:
FIGS. 7A to 7D are waveform diagrams showing the waveform on each section of the Class-D amplifier.
Figure 7B:
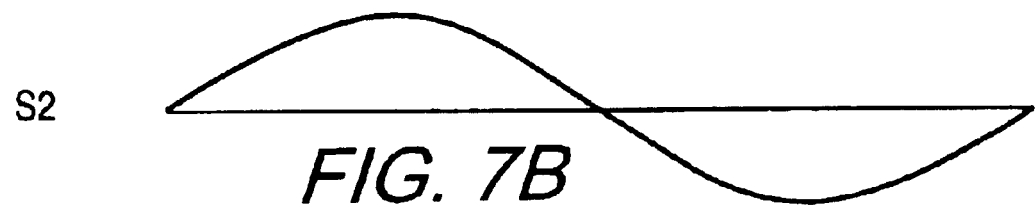
Figure 7C:
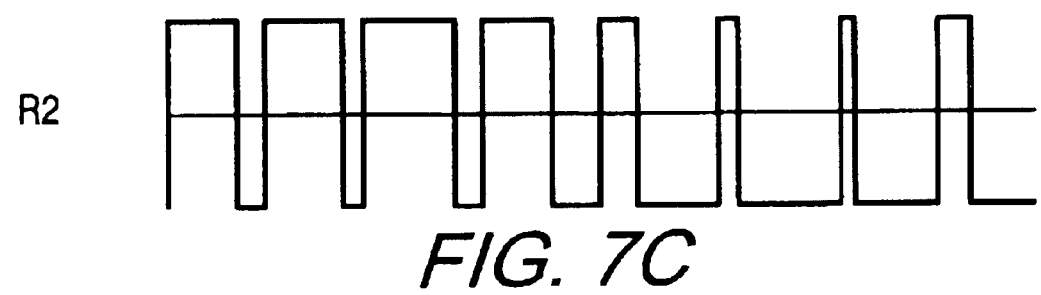
Figure 7D:
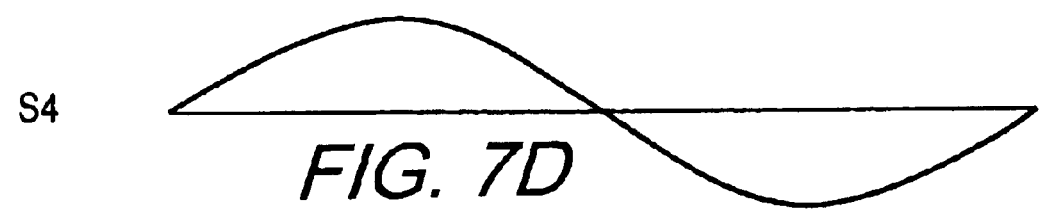
Figure 8:
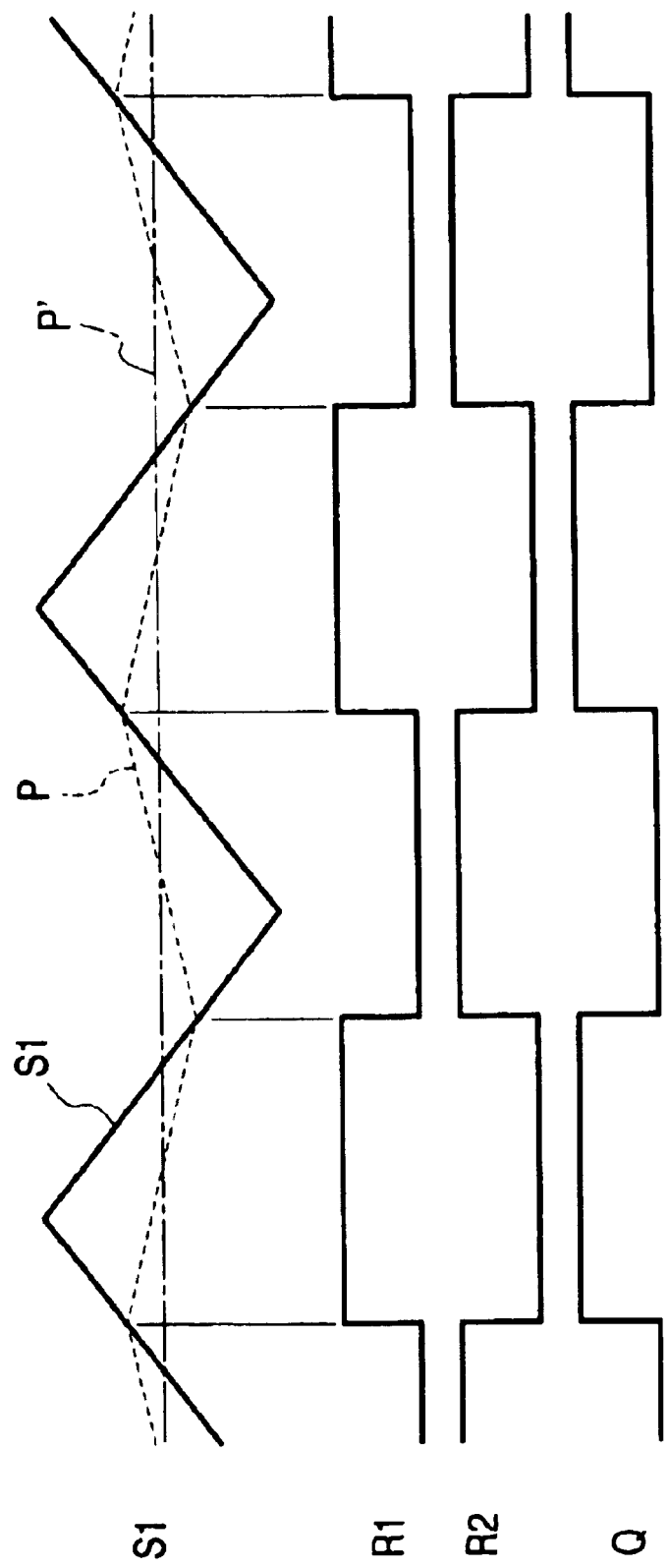
FIG. 8 is a waveform diagram showing the waveform on each section of the Class-D amplifier.

FIG. 5 is a circuit diagram showing an example of Class-D amplifier using a triangular wave generating circuit shown in FIG. 1. In FIG. 5, the sections equivalent to those in FIG. 9 are given the same numerals and signs. The circuit shown in FIG. 5 differs from that shown in FIG. 9: the inverted input terminal of the comparator 104 is connected to the common terminal of a manual selector switch 91, a first contact of the switch 91 is connected to the common terminal of a switch 92 which can be manually selected, and a second contact of the switch 91 is connected to the output terminal of the triangular wave generating circuit 102. The switch 92 is driven by a signal on the non-inverted output terminal R2 of the comparator 104. When the signal on the non-inverted output terminal R2 is high, the common terminal is connected to the first contact. When it is low, the common terminal is connected to the second contact. To the first contact and second contact of the switch 92 are supplied the voltages VM3 and VP3 respectively. In this case, the voltages VM3 and VP3 are obtained using the following expressions:

$$VM3 = VMX/b \quad (5)$$
$$VP3 = VPX/b \quad (6)$$

where b is a positive constant.

In this configuration, when the manual selector switch 91 is placed in the second contact position, the output of the triangular wave generating circuit 102 is input to the non-inverted input terminal of the comparator 104, which causes the circuit to operate as a separately excited PWM modulation circuit. On the other hand, when the switch 91 is placed in the first contact position, the circuit is operated as a self excited PWM modulation circuit. In this case, the gain G from the input terminal P of the comparator 104 to the junction Q of the switching elements 106, 106' is obtained using the following expression:

$$G = (VPX - VMX)/(VP3 - VM3) \quad (7)$$
$$= (VPX - VMX)/(VPX/b - VMX/b)$$
$$= b$$

In this way, the gain G is not influenced by variations in the source voltages VPX, VMX supplied to the switching elements 106, 106'.

As mentioned hereinabove, according to the invention, it is possible to generate a high-precision triangular wave with negligible variations in the peak value and a negligible offset deviation. According to the invention, it is further possible to obtain stable operation not influenced by variations in the source voltages supplied to switching elements.

What is claimed is:

1. A triangular wave generating circuit used in a Class-D amplifier, comprising:

an integrating unit including an amplifier and a capacitor inserted between the input terminal and output terminal of the amplifier;

a first constant-current unit which recharges the capacitor so that the output of the amplifier approaches a first predetermined voltage;

a second constant-current unit which recharges the capacitor so that the output of the amplifier approaches a second predetermined voltage;

a current setting unit which sets currents of the first and second constant-current units;

a first switch unit which makes ON/OFF control of the current flowing in the first constant-current unit;

a second switch unit which makes ON/OFF control of the current flowing in the second constant-current unit;

a first comparing unit which compares the output of the amplifier with the first predetermined voltage and outputs a signal when the output of the amplifier coincides with the first predetermined voltage;

a second comparing unit which compares the output of the amplifier with the second predetermined voltage and outputs a signal when the output of the amplifier coincides with the second predetermined voltage; and a flip-flop whose output signal is inverted depending on the output of the first and second comparing unit, the flip-flop making ON/OFF control of the first and second switch units.

2. The triangular wave generating circuit according to claim 1, wherein the current setting unit includes:

a phase comparing unit which compares the phase of an externally supplied clock pulse with the phase of the output of the flip-flop, a low-pass filter for removing the high-frequency component of the output of the phase comparing unit, and a current control unit which controls the currents of the first and second constant-current unit.

3. A triangular wave generating circuit used in a Class-D amplifier, comprising:

an integrating unit including an amplifier and a capacitor inserted between the input terminal and output terminal of the amplifier;

a first current mirror circuit which recharges the capacitor so that the output of the amplifier approaches a first predetermined voltage;

a second current mirror circuit which recharges the capacitor so that the output of the amplifier approaches a second predetermined voltage;

a first switch unit which makes ON/OFF control of the current flowing in the first current mirror circuit;

a second switch unit which makes ON/OFF control of the current flowing in the second current mirror circuit;

a first comparing unit which compares the output of the amplifier with the first predetermined voltage and outputs a signal when the output of the amplifier coincides with the first predetermined voltage;

a second comparing unit which compares the output of the amplifier with the second predetermined voltage and outputs a signal when the output of the amplifier coincides with the second predetermined voltage;

a flip-flop whose output signal is inverted depending on the output of the first and second comparing units, the flip-flop making ON/OFF control of the first and second switch units;

a phase comparing unit which compares the phase of an externally supplied clock pulse with the phase of the output of the flip-flop;

a low-pass filter which removes the high-frequency component of the output of the phase comparing unit, and a current control unit which controls the currents of the first and second current mirror circuits.

4. A Class-D amplifier comprising:

a modulation stage which PWM-modulates an input signal by using a triangular wave output from a triangular wave generating circuit; and a switching amplification stage which makes switching amplification of the output of the modulation stage by using a switching element, wherein the triangular wave generating circuit includes, a voltage divider circuit for dividing the positive source voltage and negative source voltage of the switching amplification stage at a predetermined division ratio respectively and outputting the resulting voltages as a first voltage and a second voltage, an integrating unit including an amplifier and a capacitor inserted between the input terminal and output terminal of the amplifier, a first constant-current unit which recharges the capacitor so that the output of the amplifier approaches a first predetermined voltage, a second constant-current unit which recharges the capacitor so that the output of the amplifier approaches a second predetermined voltage, a current setting unit which sets currents of the first and second constant-current units, a first switch unit which makes ON/OFF control of the current flowing in the first constant-current units, a second switch unit which makes ON/OFF control of the current flowing in the second constant-current unit, a first comparing unit which compares the output of the amplifier with the first predetermined voltage and outputs a signal when the output of the amplifier coincides with the first predetermined voltage, a second comparing unit which compares the output of the amplifier with the second predetermined voltage and outputs a signal when the output of the amplifier coincides with the second predetermined voltage, and a flip-flop whose output signal is inverted depending on the output of the first and second comparing units, the flip-flop making ON/OFF control of the first and second switch units.

\* \* \* \* \*